United States Patent
Zhou et al.

(10) Patent No.: US 6,475,810 B1
(45) Date of Patent: Nov. 5, 2002

(54) METHOD OF MANUFACTURING EMBEDDED ORGANIC STOP LAYER FOR DUAL DAMASCENE PATTERNING

(75) Inventors: Mei Sheng Zhou; John Leonard Sudijono; Subhash Gupta; Sudipto Ranendra Roy; Paul Kwok Keung Ho; Yi Xu; Simon Chooi; Yakub Aliyu, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/636,579

(22) Filed: Aug. 10, 2000

(51) Int. Cl.$^7$ ............................................. H01L 21/58
(52) U.S. Cl. ...................... 436/633; 438/622; 438/637
(58) Field of Search .................... 438/633–636, 438/639, 687, 666, 672, 717, 723, 724; 430/270, 271, 325

(56) References Cited

U.S. PATENT DOCUMENTS

| | | | |
|---|---|---|---|
| 5,741,626 A | * 4/1998 | Jain et al. ................. | 430/314 |
| 5,874,201 A | 2/1999 | Licata et al. ............... | 430/314 |
| 5,882,996 A | 3/1999 | Dai ........................... | 438/597 |
| 5,989,997 A | 11/1999 | Lin et al. ................... | 438/622 |
| 6,004,883 A | 12/1999 | Yu et al. .................... | 438/706 |
| 6,007,733 A | 12/1999 | Jang et al. ................. | 216/80 |
| 6,040,243 A | * 3/2000 | Li et al. ..................... | 438/678 |
| 6,066,569 A | * 5/2000 | Tobben ...................... | 438/717 |
| 6,127,089 A | * 10/2000 | Subramanian et al. ...... | 430/270 |
| 6,165,891 A | * 12/2000 | Chooi et al. ................ | 438/622 |

* cited by examiner

*Primary Examiner*—Hoai Ho
*Assistant Examiner*—Dung A Le
(74) *Attorney, Agent, or Firm*—George O. Saile; Rosemary L. S. Pike; William J Stoffel

(57) ABSTRACT

A new method of forming a dual damascene interconnect structure, wherein damage of interconnect and contamination of dielectrics during etching is minimized by having an embedded organic stop layer over the lower interconnect and later etching the organic stop layer with an H2 containing plasma, or hydrogen radical.

24 Claims, 5 Drawing Sheets

METHOD OF MANUFACTURING EMBEDDED ORGANIC STOP LAYER FOR DUAL DAMASCENE PATTERNING

BACKGROUND OF THE INVENTION

1. Field of Invention

The present invention relates generally to an improved ultra large-scale integrated (ULSI) circuit having an embedded organic stop layer. More particularly, the present invention relates to the fabrication of ULSI using a dual damascene process in conjunction with an embedded organic stop layer.

2. Description of Prior Art

The dual damascene process, in which metal interconnect is buried inside patterned grooves in a substrate, is frequently used and has become one of the best methods for fabricating USLI circuits Conventionally, metallic interconnects are formed by depositing a metallic layer over an insulating layer, for example, a silicon dioxide layer. Then, the insulating layer is etched to form a pattern of predefined conductive lines so that a vertical via hole can be formed between conductive layers. Thereafter, metallic material is deposited into the via hole to complete vertical connection between the conductive layers.

Workers in the art are aware that the metallic layer at the bottom of the via hole is exposed and unprotected, and therefore will be etched in the process of forming the via hole. Consequently, the metallic layer can be easily damaged resulting in a change in device properties, and ultimately even not being able to use the device is possible. Others have striven to solve this and other problems. For example U.S. Pat. No. 5,989,997 (Lin et al.) shows leaving a portion of the photo-resist remaining at the bottom of the via hole. U.S. Pat. No. 6,007,733 (Jang, et al.), U.S. Pat. No. 6,004,883 (Yu, et al.), and U.S. Pat. No. 5,741,626 (Jain, et al.) all show dual damascene processes. U.S. Pat. No. 5,882,996 (Dai) teaches a dual damascene method with etch stops and an ARC interstitial layer. Finally, U.S. Pat. No. 5,874,201 (Licata, et al.) shows a dual damascene using a spin on organic layer over the ILD layer.

SUMMARY OF THE INVENTION

Accordingly, the present invention is to provide a method for forming a dual damascene interconnect structure, wherein damage during etching is minimized by embedding an organic stop layer over the lower interconnect and later etching the organic stop layer with H2 plasma.

The present invention is a method for forming a dual damascene opening by providing a semiconductor structure, and forming a dielectric layer having an interconnect over the substrate semiconductor structure. Then in a critical step, we form an organic stop layer over the dielectric layer and the interconnect. Then we form second and third dielectric layers in sequence to form a stack dielectric layer over the organic stop layer. Finally, patterning the stack dielectric layers to form a dual damascene opening exposing the organic stop layer and using the organic stop layer as a protective cover for the interconnect, and then removing the organic stop layer to expose said interconnect. In an preferred embodiment a $H_2$ containing plasma is used to remover the remove the organic stop layer to expose said interconnect.

In another aspect of the invention the need for PEC (post etch-cleaning) and PDC (pre-deposition-cleaning) can be eliminated.

The invention's organic stop layer and $H_2$ containing plasma finishing etch step provide many advantages over the prior art. The invention's organic stop layer prevents etch damage to the underlying interconnect during the etching of the stack dielectric layers to form the damascene opening. The invention's $H_2$ plasma effectively removes the organic stop layer without damaging the underlying interconnect. Also when copper is used as the conductor in the underlying interconnect, the present invention prevents contamination to the ILD/IMD layers due to sputtering of copper onto the via sidewalls.

BRIEF DESCRIPTION OF THE DRAWINGS

In the accompanying drawings forming a material part of this description there is shown.

DETAILED DESCRIPTION OF THE INVENTION

Figure 1:
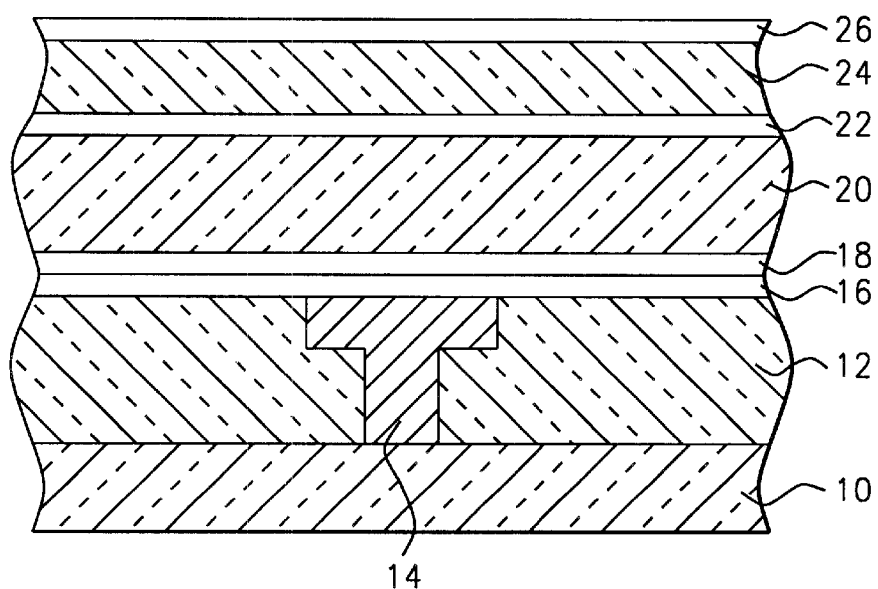
FIG. 1 shows a cross-sectional view of a semiconductor before the etch step.

Referring now more particularly to FIG. 1, a semiconductor structure 10 is provided. The semiconductor structure can be a substrate or wafer with devices built therein and having overlying conductive and insulating layer.

Then, a dielectric layer 12 having an interconnect 14 is formed over the substrate 10. The dielectric layer 12 (or insulating layer) is preferably composed of a silcon oxide. The dielectric layer 12 can be an inter-level dielectric (ILD) layer (e.g, formed on the wafer) or an inter metal dielectric (IMD) layer (e.g., formed on a ILD layer or another IMD layer).

The lower interconnect 14 can be a contact to the wafer surface or device on the wafer or a higher level interconnect. The interconnect is preferably comprised of copper or a copper alloy, but can be composed of polysilcon, a polycide or other conductive materials.

An embedded organic stop layer 16 is then formed over the dielectric layer 12 and the interconnect. The embedded organic stop layer 16 is preferably a low k material, such as polyamides, polyimides, perfluorinated, polyethylene, perfluorinated, or polypropylene. Commercially available low k materials are FLARE™ manufactured by Allied Signal comprised of poly (arylene) ether or SiLK™ manufactured by Dow Chemicals and BENZOCYCLO-BUTENE (BCB).

The embedded organic stop layer 16 preferably has a thickness of between about 50 and 1,000 Å.

A passivation layer 18 (optional) is formed above the embedded organic stop layer 16. The passivation layer 18 is composed of silicon nitride, silicon oxynitride, or silicon carbide. The passivation layer 18 preferably has a thickness of between about 50 and 1,000 Å. The inclusion of layer 18 depends on whether the etching of the via can stop on layer 16.

Next, we form a dielectric layer (e.g., 20 24) over the passivation layer. The dielectric layer can be comprised of only one, or several insulating layers and/or etch stop layers. A preferred configuration is shown in FIG. 1. The dielectric layers 12, 20, and 24 can be doped silicon oxide deposited by any conventional method or SiO2 formed by any conventional method. The passivation layer can be eliminated if the organic stop layer can itself passivate the copper.

Still referring to FIG. 1. the dielectric layer 20 (lower dielectric layer) can be composed of any known dielectric materials, or silicon oxide and is most preferably composed of SiO2. Layer 20 can also be made of the same materials of layer 16, but only if the removal of layer 16 does not effect layer 20. Dielectric layer 20 preferably has a thickness of between about 3,000 and 10,000 Å.

An optional etch stop layer 22 is then formed on dielectric layer 20. The etch stop layer is preferably comprised of SiN, oxynitride or STC. The etch stop layer 22 preferably has thickness of between about 50 and 1,000 Å.

Next, another dielectric layer 24 (upper dielectric layer) is formed on etch stop layer 22. The dielectric layer 24 can be comprised of the same materials as dielectric layer 20. The dielectric layer 24 preferably has a thickness of between about 3,000 and 10,000 Å.

Finally, a cap layer 26, which is also optional, can be formed on dielectric layer 24. The cap layer is preferably composed of silicon nitride, silicon oxynitride, or silicon carbon. The cap layer preferably has a thickness of between about 50 and 1,000 Å.

Figure 2A:
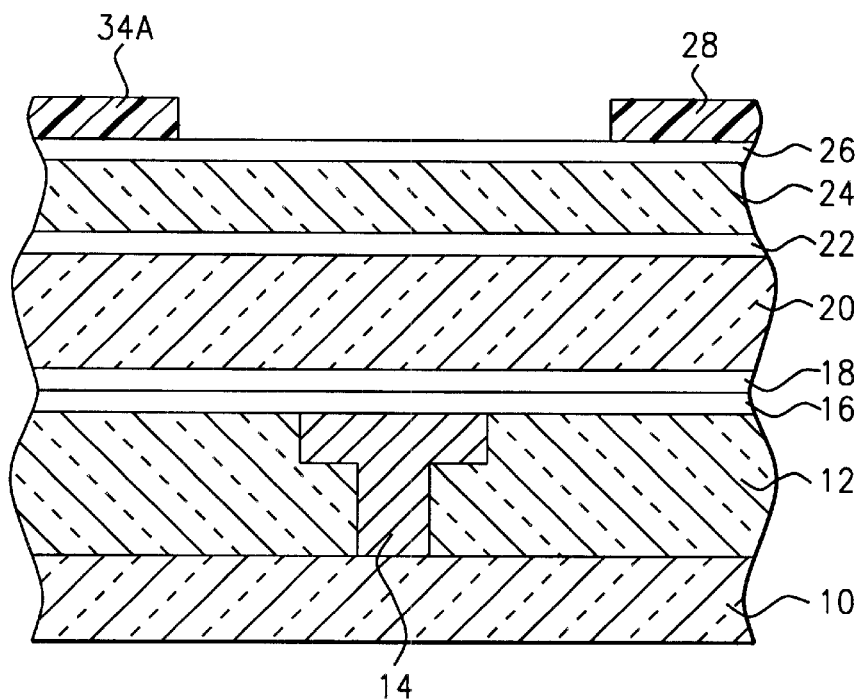
FIGS. 2A through B show a cross-sectional view of a semiconductor in progression of manufacturing steps in producing a dual damascene semiconductor according to the present invention.
Figure 2B:
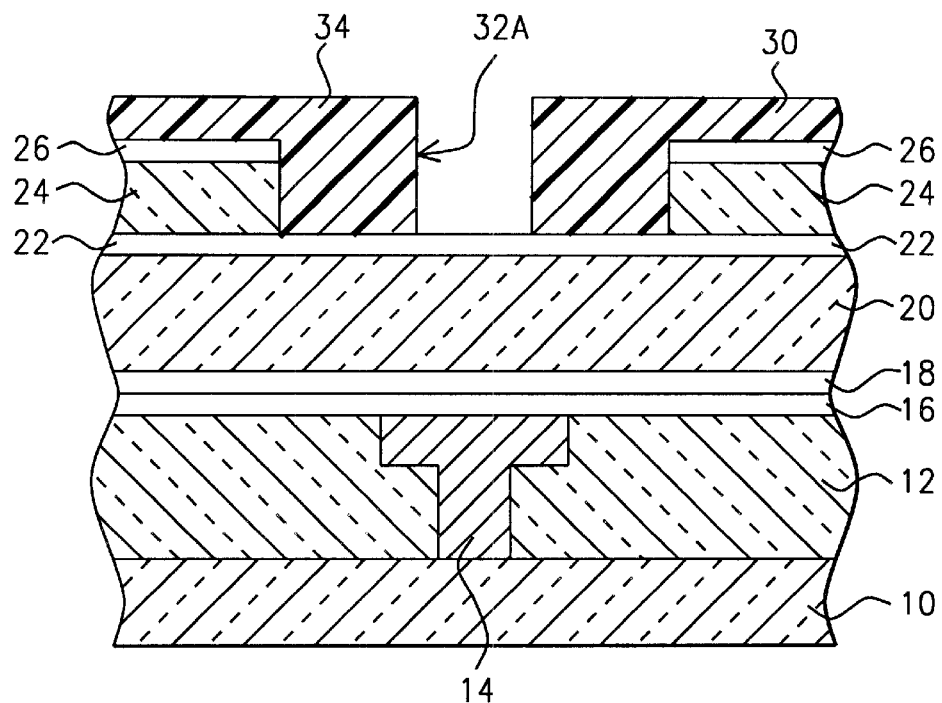
Figure 5:
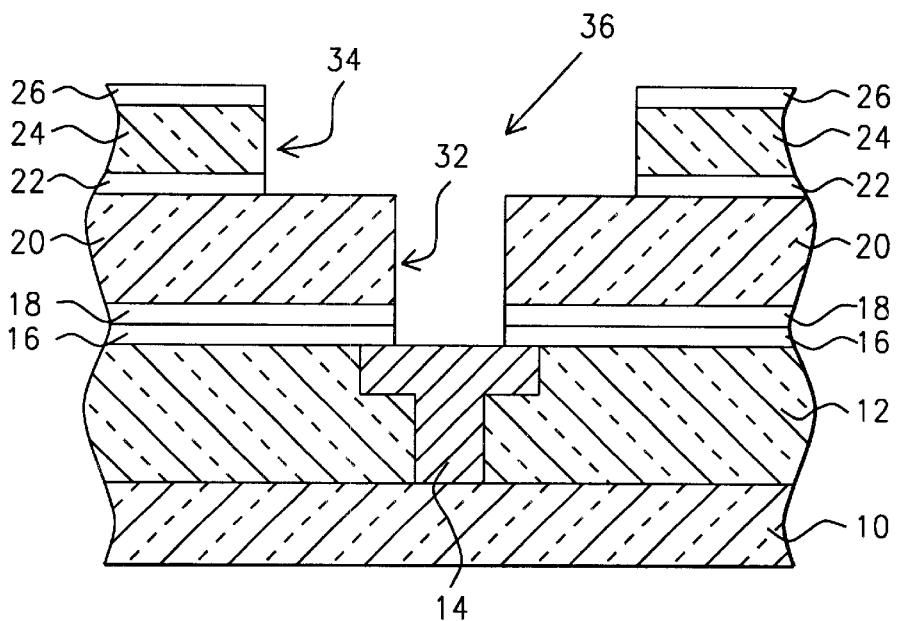
FIG. 5 is a cross-sectional view of a semiconductor after conventional etch steps but after the opening of an embedded organic stop layer.
Figure 6:
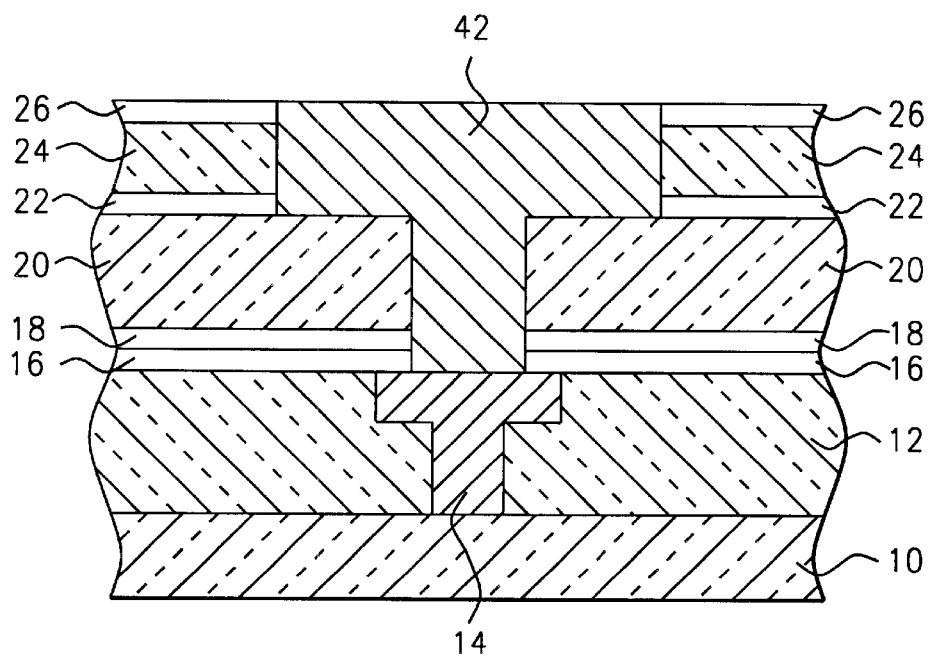
FIG. 6 is a cross-sectional view of a semiconductor of the current invention.

Many methods can be used to form the interconnect opening or dual damascene opening. The methods shown in this patent are not limiting and many other methods can be used. Also, the opening 36 can have any shape and is not limited to a dual damascene opening. For example, the opening 36 can be a conventional straight walled interconnect or line opening, As shown in FIG. 5, the dual damascene opening 36 can be considered as comprised of 2 openings: a bottom trench or via opening 32 and a top trench opening 34. The trench openings can be formed in any order. FIGS. 2a thru 2B show a first embodiment and FIGS. 3a and 3B show a 2$^{nd}$ embodiment for forming the dual damascene opening.

Referring to FIGS. 2A and 2b, thereafter, a photo-resist layer 28 having a top trench resist opening 34A is formed over the cap layer 26. Then, a conventional etching creates a first trench pattern 34. Photo-resist layer 28 is removed.

Figure 4:
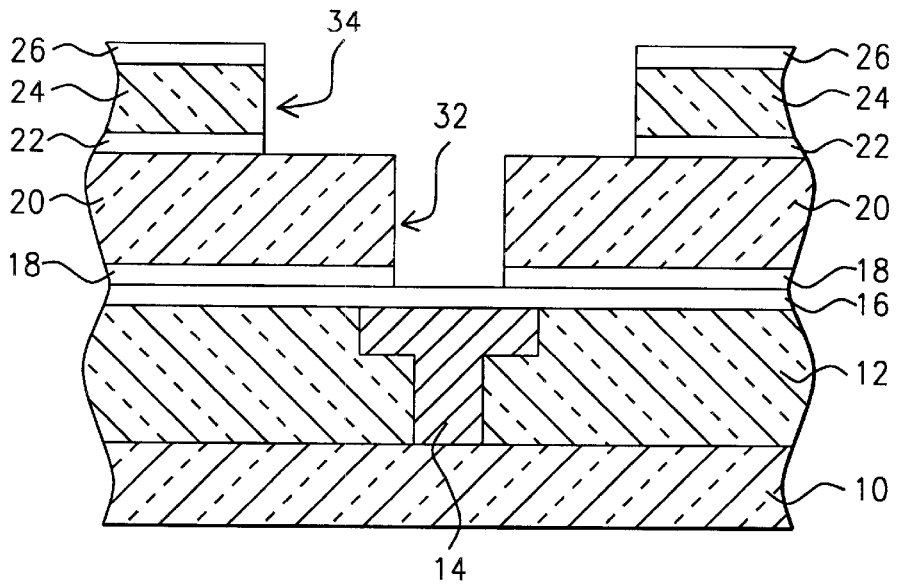
FIG. 4 is a cross-sectional view of a semiconductor after conventional etch steps but before the opening of an embedded organic stop layer.

As shown in FIG. 2B, another photo-resist layer 30 is formed with a bottom trench resist opening 32A. A bottom trench opening 32 is formed in the dielectric layer 20 as shown in FIG. 4.

Figure 3A:
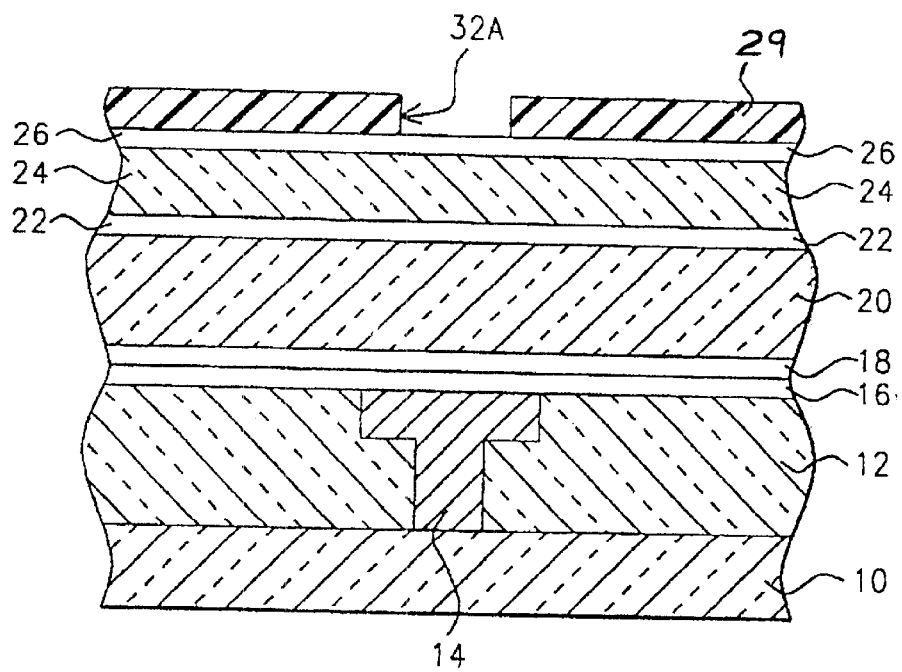
FIGS. 3A through B show a cross-sectional view of a semiconductor in progression of manufacturing steps of a second embodiment in producing a dual damascene semiconductor according to the present invention.
Figure 3B:
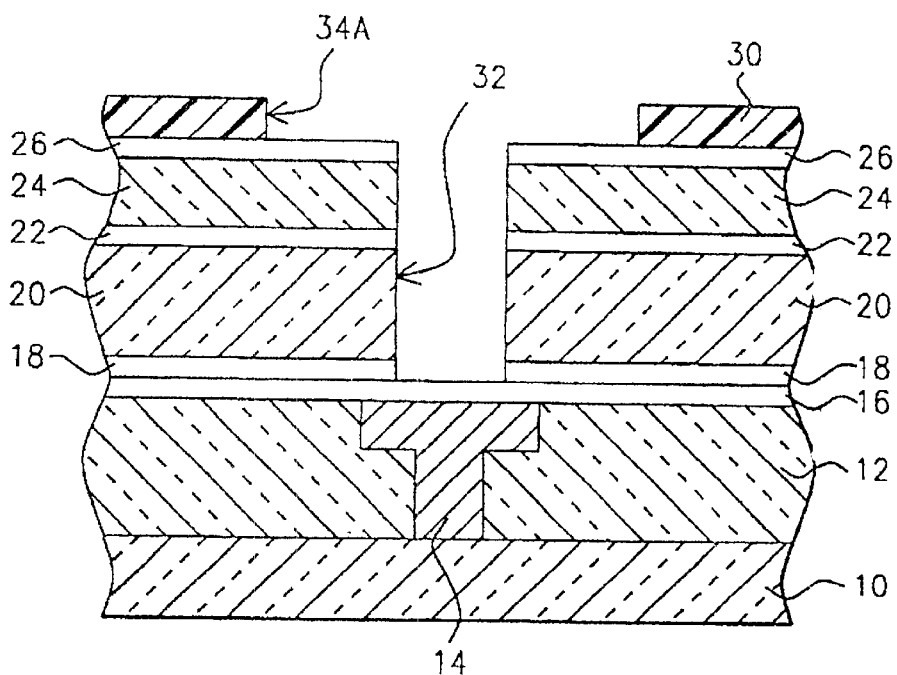

As shown in FIG. 3A a first photoresist layer 29 having a bottom trench resist opening 32A is formed over the dielectric layer 24. The dielectric layers 24 and 20 are etching to form the bottom trench opening 32.

As shown in FIG. 3B a second photoresist layer 31 having a top trench resist opening 34A is shown. The top trench opening 34 is etched in the dielectric layer 24.

The openings in the dielectric layer are etched using conventional RIE etch. A preferred reactive ion (RIE) etch using fluorocarbon plasma with an electrode power of about 500 to 2000W at a pressure of about 10 to 100 mT. In conventional methods, this RIE etch damages the underlying interconnect 14.

In either scenario of conventional etching which ever etch goes through passivation layer 18 does not go through embedded organic stop layer 16. This organic layer 16 is at the bottom of the trench pattern 34 and resolves the problems caused by conventional methods. Namely, the interconnect 14 in no longer exposed and unprotected, and therefore will not be etched and damaged in the process of forming the via hole. Also, there will not be any sputtering of interconnect 14 on to the trench or via sidewall of 32 and thus contamination of the dielectrics 20 and 24 by interconnect 14 is avoided.

As shown in FIG. 5, finally the embedded organic stop layer 16 is removed to expose the underlying interconnect 14 and to create the final dual damascene trench pattern 36. The stop layer 16 is preferably removed using H2 containing down stream plasma or hydrogen radical.

Next, preferably a post etch cleaning is performed. Subsequently, a pre-deposition cleaning is performed. Thereafter, a second interconnect 42 is formed in the interconnect opening 36. The second interconnect can be comprised of barrier layers, seed layers and metal conductor layers. The interconnect is preferably formed of a metallic material for example, copper or copper-aluminum alloy.

The advantage of using this method of fabrication is protecting the metallic layer of copper 14 from etching when the trench pattern 34 is formed, through the presence of the organic stop layer 16. A further advantage of using this method of fabrication is to prevent the contamination of dielectric layers 20 and 24 by the underlying interconnect 14 during RIE etching.

Figure 7:
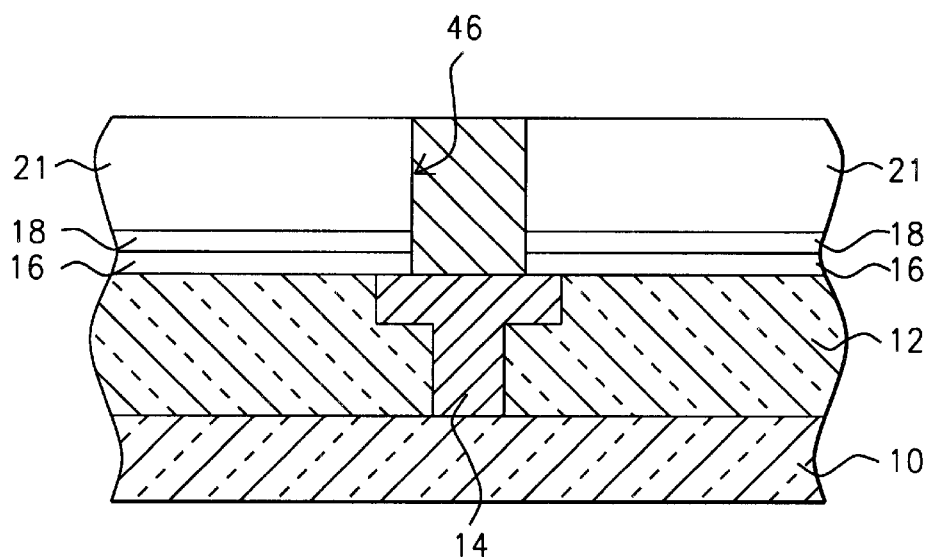
FIG. 7 is a cross-sectional view of a simplified structure with an interconnect.

FIG. 7 shows a simplified structure where the invention's organic stop layer 16 is formed over a lower interconnect 14. A conventional straight opening 46 is formed in the dielectric layer 21. The invention's key organic stop layer 16 protects the lower interconnect 14 from etch damage when etching the interconnect opening 46 thru the dielectric layer 21.

While the invention has been particularly shown and described with reference to the preferred embodiments thereof, it will be understood by those skilled in the art that various changes in form, and details may be made without departing from the spirit and scope of the invention.

What is claimed is:

1. A method for forming a interconnect opening comprising:
   providing a semiconductor structure having a first dielectric layer and a lower interconnect;
   forming an organic stop layer over said first dielectric layer and said lower interconnect;
   forming a stack dielectric layer over said organic stop layer;
   patterning and etching said stack dielectric layer to form an upper interconnect opening using said organic stop layer as a protective cover;
   in a separate step from the above patterning step, removing said organic stop layer to expose said lower interconnect.

2. The method of claim 1, wherein said stack dielectric layer consists of one dielectric layer.

3. The method of claim 1, wherein said stack dielectric layer is comprised of a second layer and a third dielectric layer.

4. The method of claim 1, wherein the organic stop layer is a passivation material.

5. The method of claim 1, wherein the dielectric layers are one of the following:
   a. doped silicon oxide, or
   b. SiO2.

6. A method for forming a dual damascene opening comprising:
   providing a semiconductor structure;
   forming a first dielectric layer having a lower interconnect over said semiconductor structure;
   forming an organic stop layer over said first dielectric layer and said lower interconnect;
   forming a second and third dielectric layers in sequence to form a stack dielectric layer over said organic stop layer;
   patterning the stack dielectric layers to form a dual damascene opening exposing said organic stop layer using the organic stop layer as a protective cover for the interconnect and a prevention of contamination of dielectric layers by said lower interconnect during etching;
   removing said organic stop layer to expose said lower interconnect.

7. The method of claim 6, wherein a metal is deposited in the dual damascene opening to form an upper interconnect.

8. The method of claim 7, wherein an etch stop layer is formed between the second and third dielectric.

9. The method of claim 6, wherein a passivation layer is formed between the organic stop layer and the stack dielectric layer.

10. The method of claim 9, wherein a cap layer is formed on the stack dielectric layers.

11. The method of claim 9, wherein the passivation layer is one of the following: silicon nitride, silicon oxynitride, or silicon carbide.

12. The method of claim 6, wherein an etch stop layer is formed between the second and third dielectric layers.

13. The method of claim 6, wherein a cap layer is formed on the stack dielectric layers.

14. The method of claim 6, wherein the organic stop layer is opened using H2 containing plasma or hydrogen radical.

15. The method of claim 6, wherein the lower interconnect is comprised of copper.

16. The method of claim 6, wherein the organic stop layer is a low k material.

17. The method of claim 15, wherein the low k material has a lower dielectric constant than silicon oxide and is comprised of an organic material.

18. The method of claim 15, wherein the organic material is polyarylene, polyarylene ether, perfluorinated polyarylene, or perfluorinated polyarylene ether.

19. The method of claim 6, wherein the organic stop layer is comprised of polyamides, polyimides, perfluorinated, polyethylene, perfluorinated, or polypropylene.

20. The method of claim 6, wherein the dielectric layers are one of the following:
   c. doped silicon oxide, or
   d. SiO2.

21. A method for forming a dual damascene opening comprising:
   providing a semiconductor structure;
   forming a first dielectric layer having a lower interconnect over said semiconductor structure;
   forming an organic stop layer over said first dielectric layer and said lower interconnect;
   forming a second and third dielectric layers in sequence to form a stack dielectric layer over said organic stop layer;
   patterning the stack dielectric layers to form a dual damascene opening exposing said organic stop layer using the organic stop layer as a protective cover for the interconnect and a prevention of contamination of dielectric layers by said lower interconnect during etching;
   in a separate step from the above patterning step, removing said organic stop layer to expose said lower interconnect.

22. The method of claim 21, wherein a metal is deposited in the dual damascene opening to form an upper interconnect.

23. The method of claim 21, wherein a passivation layer is formed between the organic stop layer and the stack dielectric layer.

24. The method of claim 21, wherein the organic stop layer is opened using H2 containing plasma or hydrogen radical.

* * * * *